United States Patent [19]

Cross et al.

[11] 4,352,207
[45] Sep. 28, 1982

[54] NOISE SUPPRESSION CIRCUIT

[75] Inventors: James A. Cross, Azusa; John E. Snyder, Diamond Bar, both of Calif.

[73] Assignee: R.F. Technical Products, Inc., Diamond Bar, Calif.

[21] Appl. No.: 141,603

[22] Filed: Apr. 18, 1980

[51] Int. Cl.³ .............................................. H04B 1/10
[52] U.S. Cl. .................... 455/223; 455/286; 455/290
[58] Field of Search ............... 455/222, 223, 271, 283, 455/286, 290, 296, 307, 287; 343/701

[56] References Cited

U.S. PATENT DOCUMENTS

| | | | |
|---|---|---|---|
| 2,760,061 | 8/1956 | Pan et al. | 455/286 |
| 2,791,686 | 5/1957 | Lambert | 455/286 |
| 3,623,144 | 11/1971 | Fischel | 455/223 |
| 3,694,754 | 9/1972 | Baltzer | 455/287 |

FOREIGN PATENT DOCUMENTS

| | | | |
|---|---|---|---|
| 2051891 | 7/1978 | Fed. Rep. of Germany | 455/224 |
| 2829757 | 1/1979 | Fed. Rep. of Germany | 455/283 |
| 1540973 | 2/1979 | United Kingdom | 455/223 |

*Primary Examiner*—Jin F. Ng
*Attorney, Agent, or Firm*—Smyth, Pavitt, Siegemund & Martella

[57] ABSTRACT

A noise-suppressing circuit suitable for insertion between a receiving antenna and an RF receiver to suppress noise in the RF signal received by the receiving antenna includes a bandpass filter circuit connected to receive as an input the RF signal received by the antenna, and connected in series to a blanking circuit which employs a JFET to remove from the filtered RF signal the unwanted noise spikes. The bandpass filter attenuates the components of the RF signal that have frequencies outside of the passband, and after the blanking circuit has removed the noise spikes, it passes the remainder of the filtered RF signal to the RF receiver. In a preferred embodiment, the bandpass filter circuit includes a parallel resonant circuit, and the blanking circuit includes a series resonant circuit connected between the drain and the gate of JFET of the blanking circuit.

5 Claims, 1 Drawing Figure

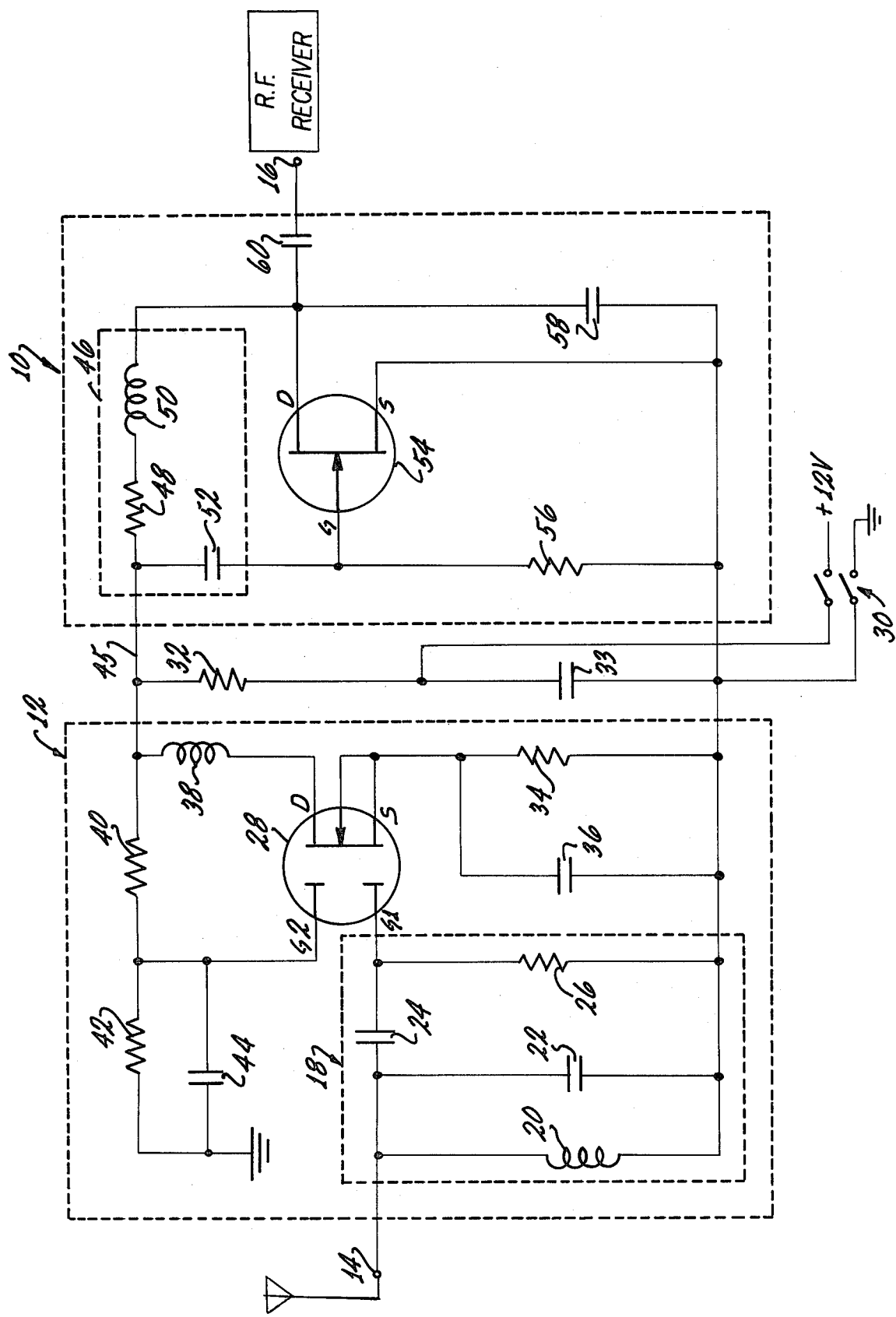

NOISE SUPPRESSION CIRCUIT

BACKGROUND OF THE INVENTION

1. Field of the Invention

The present invention is in the field of electronics, and more specifically relates to a circuit for reducing the amount of noise entering an RF receiver from an antenna.

2. The Prior Art

The present invention is a circuit which in normal use would be inserted between an antenna and a radio-frequency (RF) receiver, such as a receiver for frequency modulated (FM) signals. Accordingly, the device must be capable of passing the signal without distorting it, while at the same time removing noise that has been picked up by the antenna. In many cases of interest, this noise takes the form of noise spikes which are superimposed on the desired signal and which generally are much larger than the signal.

Many devices are known in the art that can be used for limiting, or clipping, an applied signal. For example, amplifiers and cathode followers typically produce output that are linearly related to the input for relatively small input signals, but when the input signal becomes larger, the devices are incapable of producing a proportionately large output. Once the maximum level of output has been reached, further increases in the input do not produce an increase in the output, and the output signal is said to be clipped.

The use of an amplifier in the present application is undesirable ultimately because there is no well defined level that is clipped. Instead, typically, the response curve of an amplifier makes a gradual transition from the linear region to the limiting region, and therefore signals less than the limited signals are severely distorted. Such distortion is unacceptable in the present application.

It is also known in the art that diodes can be used to clip a signal. Use is made of the property of a diode to conduct in one direction but not to conduct in the other direction. Compared to an amplifier, the diode has the advantage the signal that is passed is a faithful reproduction of the applied signal.

Known diodes are unsatisfactory for the present application. Diodes which are capable of responding fast enough tend to be excessively noisy, and this defeats the purpose of the invention which is to remove noise. At present, the more suitable diodes are many times more expensive than the components used in the present invention.

Other approaches such as notch filters or the use of blanking pulses are unacceptable because the devices interrupt the signal.

Thus, there exists a need for a relatively simple and inexpensive circuit which can be inserted between the antenna and the input of an RF receiver for the purpose of removing noise from the received signal while passing the signal with a minimum of distortion.

SUMMARY OF THE INVENTION

The present invention solves this problem by providing a relatively simple and inexpensive circuit that can be inserted between a receiving antenna and an RF receiver to suppress noise in the RF signal received by the receiving antenna. The circuit of the present invention employs field effect transistors advantageously, enabling the circuits to respond faster and to be less expensive than would be the case if diodes were used. Compared to the use of an amplifier for clipping the signal, the present invention has the advantage of not distorting the signal.

In accordance with the present invention, there is provided a blanking circuit for clipping off those portions of the RF signal that exceed a present level, and for passing the remainder of the signal to the RF receiver.

In a preferred embodiment, a bandpass filter circuit is connected to the receiving antenna to receive an RF signal, and that filter circuit attenuates those components of the RF signal that have frequencies outside the pass band. The output of the bandpass filter circuit is then fed to the blanking circuit which does the clipping of the noise, and the output of the blanking circuit is passed to the RF receiver.

In a preferred embodiment of the invention, the bandpass filter circuit is highly tuned through the use of a parallel RLC circuit, and the blanking circuit includes a series RLC circuit tuned to the same frequency as the parallel RLC circuit.

Other objects and advantages of the present invention will become apparent from the detailed description which follows, read in reference to the drawing, which shows a schematic circuit diagram of a preferred embodiment of the invention.

DETAILED DESCRIPTION OF THE PREFERRED EMBODIMENT

In a preferred embodiment, the noise suppressing circuit of the present invention includes a blanking circuit 10 and a bandpass filter circuit 12 which are connected in series between an input terminal 14 and an output terminal 16. The input terminal 14 is normally connected to the receiving antenna, and the output terminal 16 is normally connected to a radio frequency (RF) receiver. The receiver may be either an AM or an FM receiver, and the circuit can readily be adapted for other types of receivers.

The signal received by the antenna and applied at the input terminal 14 includes both the desired signal as well as noise components. The latter typically are in the form of spikes superimposed on the desired signal. The received signal is first applied to the parallel resonance circuit 18 of the bandpass filter circuit 12. The parallel resonance circuit 18 includes an inductor 20, a capacitor 22, the capacitor 24, and the resistor 26 connected as shown. The output of the parallel resonance circuit 18 is applied to the gate G1 of the dual gate MOSFET (metal oxide semiconductor field effect transistor). A mode switch 30 is provided to permit the circuit to operate with either an AM signal or a FM signal. The mode switch 30 is closed by an operator when it is desired to receive FM signals, and is opened to receive AM signals. The dropping resistor 32 determines the drain current when the dual gate MOSFET 28 is conducting. The capacitor 33 blocks the flow of current from the +12 volt supply to the ground when the switch 30 is closed. The resistor 34 limits the source current, while the capacitor 36 provides stability.

The MOSFET 28 is operated as a tuned feedback amplifier with the inductor 38 and the resistor 40 being chosen to establish the resonant frequency. The resistor 42 establishes the bias level of the gate G2 of the dual gate MOS FET 28, while the capacitor 44 is used to provide stability. The feedback loop is tuned to the same frequency as the parallel resonant circuit 18.

The output of the bandpass filter circuit 12 is applied via the line 45 to the blanking circuit 10. Normally, the capacitor couples the incoming signal to the gate G of the JFET 54 to modulate the drain current in relation to the incoming signal. A series resonant circuit 46 is connected between the drain and gate of the JFET 54, and the series resonant circuit 46 is tuned to the same frequency as the parallel resonant circuit 18. A large noise spike if present on the signal applied to the gate of the JFET 54 causes the pn junction between the gate and source to become forward-biased so that the noise spike is conducted from the gate to the source and thereby shunted to ground. The resistor 56 sets the blanking level, while the capacitor 58 blocks the flow of current. The circuit further includes a coupling capacitor 60 for matching the impedance of the receiver.

In a preferred embodiment believed to be the best mode of practicing the invention for receiving signals in the frequency range from 88 to 108 MHz, the components, identified by the reference numerals used in the drawing, have the following values:

| Reference Numeral | Value |
|---|---|
| 20, 38, 50 | Micrometals Core T-37-12 with 6 turns of 20 AWG |
| 22 | 20 pf. |
| 24 | 10 pf. |
| 26 | 100K ohms |
| 28 | RCA 40673 dual gate MOSFET |
| 32 | 100 ohms |
| 33 | .01 millifarad |
| 34 | 220 ohms |
| 36 | .01 millifarad |
| 40 | 33K ohms |
| 42 | 12K ohms |
| 44 | .01 millifarad |
| 48 | 220 ohms |
| 52 | 1000 pf. |
| 54 | National J 310 JFET |
| 56 | 100K ohms |
| 58 | 10 pf. |
| 60 | 1000 pf. |

Thus, there has been described in detail a preferred embodiment of the noise suppressing circuit of the present invention, and it is seen that the circuit takes full advantage of the characteristics of the field effect transistors to achieve the objective of removing from the received signal those portions exceeding a preset voltage established by the resistor 56.

Although only a single embodiment of the present invention has been described in detail, it would be obvious to those working in the art that additional embodiments and modifications of the invention can readily be obtained to adapt the system for use in other applications. The additional embodiments are considered to be within the scope of invention which is defined by the following claims.

What is claimed is:

1. A circuit for insertion between a receiving antenna and an RF receiver to suppress noise in an RF signal received by the receiving antenna, said circuit comprising:
    a bandpass filter circuit including a parallel tuned circuit connected to the receiving antenna to receive the RF signal, for attenuating components of the RF signal that have frequencies outside of the pass band of said bandpass filter circuit and for thereby producing a filtered RF signal; and,
    a blanking circuit including a JFET responsive to the filtered RF signal to remove from the filtered RF signal those portions of the filtered RF signal that exceed a preset voltage and to pass the remainder of the filtered RF signal to the RF receiver, said blanking circuit also comprising a series tuned circuit connected between the drain and the gate of said FJET, said series tuned circuit being tuned to the same frequency as said parallel tuned circuit.

2. A circuit for insertion between a receiving antenna and an RF receiver to suppress relatively high level impulse noise in a desired radio frequency signal received by the receiving antenna, said circuit comprising:
    a diodeless blanker including a JFET responsive to a single applied signal input derived from the applied signal received by the receiving antenna to remove from the applied signal those portions of the applied signal that exceed a preset voltage and to pass the remainder of the applied signal to the receiver, there being a tuned feedback circuit tuned to the desired radio frequency connected between the drain and the gate of the JFET.

3. The circuit of claim 2 wherein said tuned feedback circuit is a series RLC circuit.

4. A circuit for insertion between a receiving antenna and an RF receiver to suppress noise in a signal received by the receiving antenna, said circuit comprising:
    a blanker including a JFET responsive to an applied signal derived from the signal received by the receiving antenna to remove from the applied signal those portions of the applied signal that exceed a preset voltage and to pass the remainder of the applied signal to the RF receiver; and,
    a tuned feedback circuit tuned to the desired radio frequency connected between the drain and the gate of the JFET.

5. The circuit of claim 4 wherein said tuned feedback circuit is a series RLC circuit.

* * * * *